United States Patent [19]

Körner et al.

[11] Patent Number: 4,896,323
[45] Date of Patent: Jan. 23, 1990

[54] PARITY-CHECKED CLOCK GENERATOR SYSTEM

[75] Inventors: Stefan Körner, Leinfelden; Klaus D. Müller, Stuttgart; Peter Rudolph, Schoenaich; Dietmar Schmunkamp, Ehningen; Halim S. Tandjung, Böblingen, all of Fed. Rep. of Germany

[73] Assignee: International Business Machines Corp., Armonk, N.Y.

[21] Appl. No.: 202,283

[22] Filed: Jun. 6, 1988

[30] Foreign Application Priority Data

Jun. 11, 1987 [EP] European Pat. Off. ........ 87108414.1

[51] Int. Cl.⁴ .............................................. G06F 11/10
[52] U.S. Cl. ..................................... 371/61; 371/49.1; 371/49.4
[58] Field of Search ..................... 371/49, 50, 61, 49.1, 371/49.4

[56] References Cited

U.S. PATENT DOCUMENTS

| | | | |
|---|---|---|---|
| 3,911,261 | 10/1975 | Taylor | 371/51.1 |
| 3,988,580 | 10/1976 | Warman et al. | 371/40.4 |
| 4,081,662 | 3/1978 | Pehrson et al. | 371/61 |
| 4,088,876 | 5/1978 | Rege | 371/57.2 |
| 4,124,898 | 11/1978 | Munter | 364/703 |
| 4,322,580 | 3/1982 | Khan et al. | 371/61 |
| 4,507,784 | 3/1985 | Procter | 371/61 |
| 4,542,509 | 9/1985 | Buchanan et al. | 371/61 |

FOREIGN PATENT DOCUMENTS 2337375 7/1977 France .

OTHER PUBLICATIONS

A. E. Linde, "Timing Pulse Checking and Distributing," *IBM Technical Disclosure Bulletin*, vol. 11, No. 10, Mar. 1969, pp. 1306–1307.

Grimes et al., Two-Dimensional Parity Error Correction Procedure, IBM Tech. Discl. Bulletin, vol. 25, No. 5, Oct. 1982, pp. 2686–2689.

*Primary Examiner*—Charles E. Atkinson
*Attorney, Agent, or Firm*—Steven J. Limanek

[57] ABSTRACT

A clock generator system is provided which includes several clock generators each containing a feedback shift register. A parity bit is calculated over the output of all shift registers and compared to an expected value. Additionally, a parity bit is calculated for each shift register, over the bits stored in the shift register, the number of ONE bits in a shift register being constant. A parity error at the output of the shift registers in combination with an error in the additional parity bit allows the correction of the erroneous clock pulse generated by the shift register in error.

8 Claims, 1 Drawing Sheet

PARITY-CHECKED CLOCK GENERATOR SYSTEM

DESCRIPTION

1. Technical Field

This invention relates to a parity-checked clock generator system.

2. Background Art

In a computer a great variety of clock pulses are needed. To generate the clock pulses usually shift registers are used into which a defined pattern of states is loaded for initialization. The content of each shift register is recirculated by means of a feedback connection. One stage of the shift register is used as output stage to obtain the desired sequence of clock pulses.

With increasing integration density, the size of the cells for the shift register latches becomes smaller and smaller. This increases the probability that the state of a shift register latch is destroyed by particles, such as, for instance, alpha particles. To check the proper operation of the clock generators, check circuits on the receiving logic or memory chips have been suggested. The detection of an error mostly leads to the start of a diagnostic program. However, this method cannot ascertain if the clock error has occurred in the clock generator itself or on the transmission path to the receiving chip. It is furthermore, not possible to correct an error. In the IBM Technical Disclosure Bulletin, March 1969, pp. 1306 and 1307, a circuit is disclosed for checking a group of clock pulses transmitted to a circuit card. A parity bit is generated for the particular configuration of clock pulses transmitted and the receiving card checks the incoming pulses. With this known circuit it is not possible to find out which one of the transmitted pulses is erroneous, and it is, therefore, not possible to correct the error.

DISCLOSURE OF THE INVENTION

It is an object of the invention to provide in a clock generator system a circuit for parity-checking a number of clock generators and for correcting clock pulse errors.

In accordance with the teachings of this invention, a clock generator system is provided which includes several clock generators each containing a feedback shift register. A parity bit is calculated over the output of all registers and compared to an expected or predetermined value. Additionally, a parity bit is calculated for each shift register, over the bits stored in the shift register, the number of ONE bits in a shift register being constant. A parity error at the output of the shift registers in combination with an error in the additional parity bit allows the correction of the erroneous clock pulse generated by the shift register in error.

The foregoing and other objects, features and advantages of the invention will be apparent from the following more particular description of the preferred embodiments of the invention, as illustrated in the accompanying drawing.

BEST MODE FOR CARRYING OUT THE INVENTION

Figure 1:
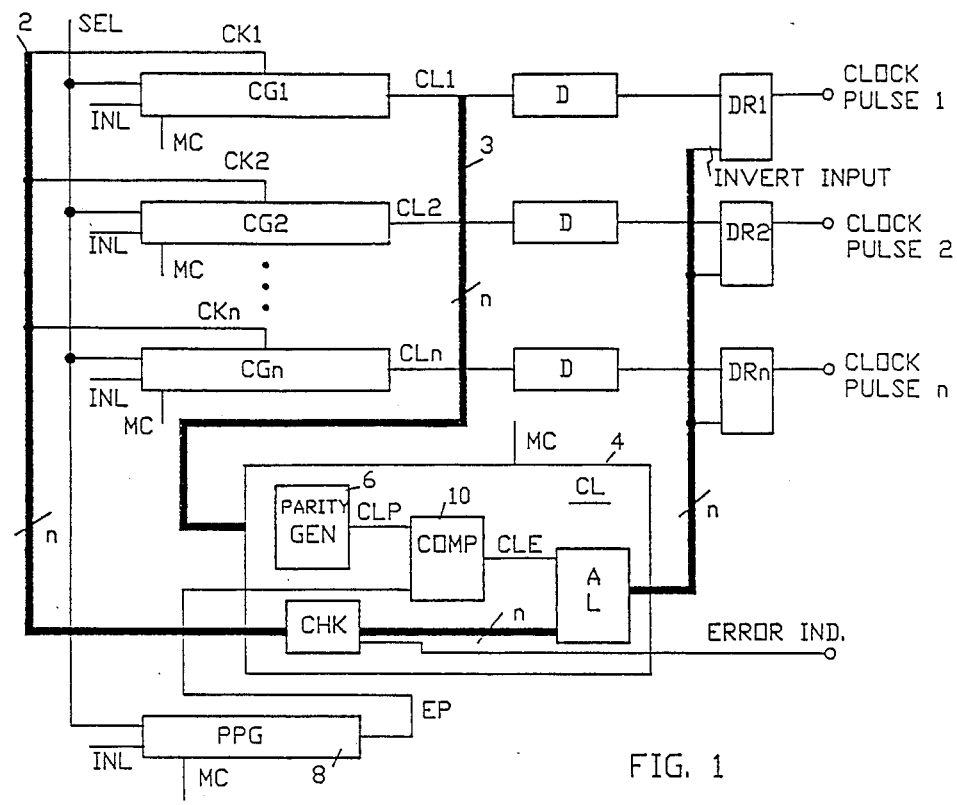
FIG. 1 shows a parity-checked clock generator system comprising a multitude of shift registers.

The clock generator system shown in FIG. 1 comprises a multitude of clock generators CG1 to CGn, each including a shift register delivering a clock pulse CL1 to CLn at its output. When the computing system is started each clock generator is loaded with a defined pattern via its initialization input INL. As shown in greater detail in FIG. 2, the shift registers in the clock generators CG each comprise a feedback connection so that a constant number of ONE bits is stored in each shift register during operation. For each clock generator CG, a parity is calculated over the ONE bits in the associated shift register and compared to an expected value. If a non-compared occurs, a corresponding check signal is sent over lines CK1 to CKn and bus 2 to a compare logic 4.

A further parity is calculated over all clock pulses CL1 to CLn generated by the clock generators. For this purpose the clock signals CL are sent via bus 3 to a parity generator 6 in the compare logic 4 which generates the parity signal CLP. A parity pattern generator 8 is provided being advanced synchronously with the clock generators and storing the parity value which should result from the outputs of the clock generators CG in an error-free case. This expected or predetermined value EP is compared with the calculated parity bit CLP in a comparator 10. Upon a non-compare, comparator 10 provides an enabling signal CLE to AND logic AL containing n AND gates, one for each clock generator CG. The other one of the two inputs of each AND gate is driven by the respective check signal CK1 to CKn, which check signals pass through a circuit CHK comprising essentially an OR gate such that an error indication will be delivered to the computing system if one of the check signals CK1 to CKn is active.

If one of the AND gates in AND logic AL is switched through, the output signal of it activies an invert input of a respective output driver DR1 to DRn. In that way, the erroneous clock signal CL1 to CLn will be inverted by the respective driver. To take account of the propagation time of the parity and check signals processed in compare logic 4, delay circuits D are inserted between each clock-generator CG and its driver DR.

By means of this self-correcting feature, the clock pulses 1 to n at the output of the drivers are always error-free if not more than one clock-generator CG is erroneous.

A synchronous operation of all clock generators, the compare logic 4 and parity pattern generator 8 is achieved by means of a main clock MC driving all these devices. Therefore, if the output signal of comparator 10 indicates that an error has occurred in the clock generators, the respective check signal CK indicates which one of the clock generators is faulty and the respective clock pulse MC of the main clock indicates which one of the stages in the clock generator shift register is faulty. The error indication signal ERROR IND. shown in FIG. 1 permits a logging operation of all relevant data and an easy diagnostic of the faulty situation. A clock recovery diagnostic program can be started and a new initialization of the clock-generators can be performed, if desired. In any case the clock generator system shown in FIG. 1 is self-correcting for a single error occurring at the simultaneous outputs of the clock generators CG and for a single error in a clock generator CG. It is also clear, however, that for different main clock pulses MC different clock generators CG can be erroneous and still be corrected.

Figure 2:
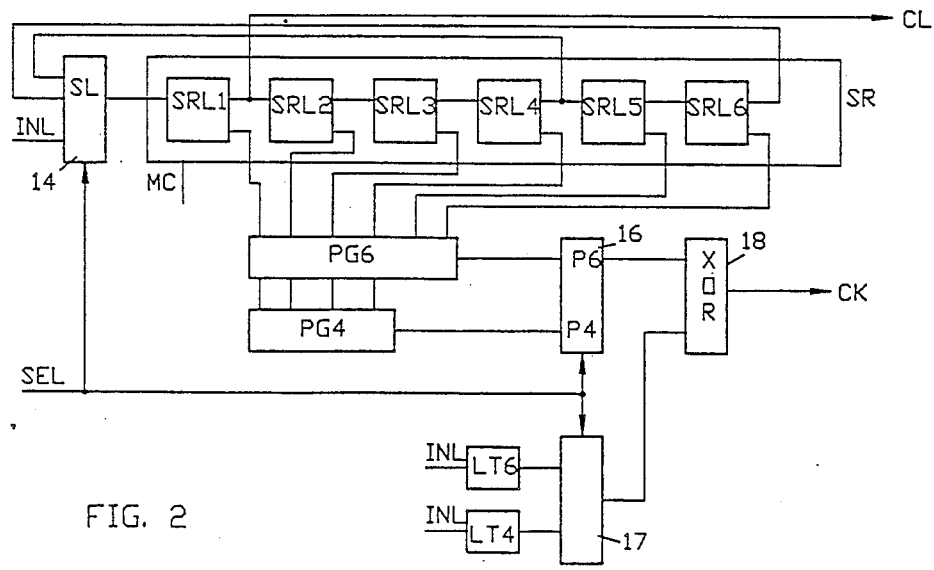
FIG. 2 shows one of the shift registers in detail, and associated parity generating and checking circuitry.

Each of the clock generators CG in FIG. 1 is constructed according to FIG. 2. It, therefore, comprises a shift register SR consisting of, for instance, six stages SRL1 to SRL6. A variation in the clock generation and checking operation is achieved in FIG. 2 by using two different lengths of register SR. A select stage 14 switches the input of register SR to the output of the fourth or sixth stage, thus using a short (S) or a long (L) part of register SR. Select stage 14 is controlled by a select signal SEL and, furthermore, passes the initialization signals INL to the shift register. The output of register SR may be taken at the output of the first stage as shown in FIG. 2. All six outputs of register SR (long section) are connected to a parity generator PG6, and the outputs of the first four stages (short section) SRL1 to SRL4 are connected to a parity generator PG4. Either the parity bit P6 generated by PG6 or the parity bit P4 generated by PG4 is transmitted to one input of an Exclusive OR gate 18 by means of a further select stage 16 being also controlled by select signal SEL.

As already indicated above, the number of ONE bits in register SR remains constant, after the initialization. Therefore, the parity over the binary ONE values in each of the short or long sections of register SR can be stored in two associated latches LT4 and LT6 upon initialization. XOR gate 18 compares the parity bit thus stored and selected by a further select stage 17 to the parity bit generated at the time of each main clock pulse MC. When the two parity bits are not equal a check signal CK is generated and delivered to compare logic 4 as indicated above.

It is seen that the use of sections of different lengths can be advantageously combined with the parity generation and checking mechanism described. Of course, any desired number of sections can be used if the means described above for each section are provided.

It may be advantageous to implement the stages of register SR by master-slave latches as more than one output signal is required from each stage.

In summary, the clock generator system described above allows the detection and correction of errors on the clock generator chip itself and does not rely on the detection of clock errors on receiving chips. It can be noted that for the detection of errors no latches are used for storing the parity bits generated at each main clock signal. Therefore, no clock signal is required to control such latches. As a result thereof, a fast error detection is achieved.

As an error is detected already on the clock generator chip, early correcting measures become possible. The parity cross-check apparatus described above calculates a parity over all clock pulses generated simultaneously at an instant of time defined by a main clock pulse, and a parity over each clock generator shift register.

A single error in the clock pulse parity and in one shift register parity thus points to the erroneous shift register. The respective main clock pulse points to the erroneous stage in this shift register.

While the invention has been particularly shown and described with reference to preferred embodiments thereof, it will be understood by those skilled in the art that various changes in form and details may be made therein without departing from the spirit and scope of the invention.

What is claimed is:

1. A clock generator system comprising
   a plurality of clock generators each containing a feedback shift register having a plurality of stages for generating clock pulses, and
   cross-checking means for calculating a first parity bit over the output signals of said clock generators and a second parity bit over the content from each of the stages of each of said shift registers, said means including compare means for comparing the calculated parity bits to stored expected parity bits.

2. A clock generator system as set forth in claim 1 further including
   means for correcting an erroneous clock pulse when the first parity bit calculated over the output signals is incorrect and when the second parity bit calculated over the content of one of said registers shift is incorrect.

3. A clock generator system as set forth in claim 2 wherein said cross-checking means further includes
   a parity generator for calculating the first parity bit over the output signals of the clock generators, and
   a comparator for comparing the first parity bit with a predetermined parity signal from a parity pattern generator and delivering a clock error signal to AND logic means including an AND gate for each clock generator, one of the AND gates being switched through when the second parity bit over the content of the respective clock generator is incorrect, the output signal of this AND gate inverting the output signal of a clock pulse driver associated with that AND gate and with the erroneous clock generator.

4. A clock generator system as set forth in claim 3 wherein said cross-checking means further includes
   said parity pattern generator being advanced synchronously with the clock generators and delivering the predetermined parity signal for each output of the clock generators, the parity pattern generator and the clock generators being loaded upon initialization of the system by appropriate initialization signals.

5. A clock generator system as set forth in claim 1 further including
   circuit means coupled to said crosschecking means for delivering an error indication signal to a computer system if one of the contents of the clock generators is faulty.

6. A clock generator system as set forth in claim 1 wherein
   said shift registers comprise sections of different lengths with a selectable number of stages, a select signal being used to select a desired section by selecting a desired feedback connection to the input of the shift register.

7. A clock generator system as set forth in claim 6 further including
   a parity generator for each section of the shift register,
   a latch for storing the expected parity for each section,
   a first select stage for selecting a feedback connection to the input of the first stage of the shift register, a second select stage for selecting the output of the parity generator corresponding to the section selected, a third select stage for selecting the latch storing the expected parity bit, the second and the third select stages being connected to an Exclusive OR gate to deliver a check signal when the content of the selected section is erroneous.

8. A clock generator system as set forth in claim 1 wherein a synchronous operation is achieved by means of main clock signals applied to said plurality of clock generators and to said crosschecking means.

* * * * *